United States Patent
Zundel et al.

(10) Patent No.: US 9,306,011 B2
(45) Date of Patent: Apr. 5, 2016

(54) SEMICONDUCTOR DEVICE HAVING AREAS WITH DIFFERENT CONDUCTIVITY TYPES AND DIFFERENT DOPING CONCENTRATIONS

(71) Applicant: Infineon Technologies AG, Neubiberg (DE)

(72) Inventors: Markus Zundel, Egmating (DE); Thomas Schweinboeck, Grafing (DE); Jesper Wittborn, Bromma (SE); Erwin Bacher, Villach (AT); Juergen Holzmueller, Vierkirchen (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 107 days.

(21) Appl. No.: 14/049,839

(22) Filed: Oct. 9, 2013

(65) Prior Publication Data
US 2015/0097184 A1   Apr. 9, 2015

(51) Int. Cl.
| | |
|---|---|
| *H01L 23/58* | (2006.01) |
| *H01L 29/36* | (2006.01) |
| *H01L 21/265* | (2006.01) |
| *H01L 21/66* | (2006.01) |
| *H01L 51/05* | (2006.01) |
| *H01L 29/06* | (2006.01) |
| H01L 21/266 | (2006.01) |

(52) U.S. Cl.
CPC ............. *H01L 29/36* (2013.01); *H01L 21/265* (2013.01); *H01L 22/30* (2013.01); *H01L 22/32* (2013.01); *H01L 22/34* (2013.01); *H01L 29/0692* (2013.01); *H01L 51/05* (2013.01); *H01L 21/266* (2013.01)

(58) Field of Classification Search
CPC ............. H01L 21/265; H01L 2924/00; H01L 2924/00014; H01L 2224/48227; H01L 2224/73265
USPC ............................. 257/48, E21.531, E23.141
See application file for complete search history.

(56) References Cited

U.S. PATENT DOCUMENTS

2014/0175610 A1 *   6/2014   Zhang et al. .................. 257/546

OTHER PUBLICATIONS

Stangoni, Maria. "Scanning Probe Techniques for Dopant Profile Characterization." A Dissertation submitted to the Swiss Federal Institute of Technology, Zurich Sweden. Published in 2005. 8 Pages.

* cited by examiner

*Primary Examiner* — Andy Huynh
(74) *Attorney, Agent, or Firm* — Eschweiler & Associates, LLC

(57) ABSTRACT

A semiconductor device includes a semiconductor substrate. The semiconductor substrate includes a plurality of first doping regions of a first doping structure arranged at a main surface of the semiconductor substrate and a plurality of second doping regions of the first doping structure arranged at the main surface of the semiconductor substrate. The first doping regions of the plurality of first doping regions of the first doping structure include dopants of a first conductivity type with different doping concentrations. Further, the second doping regions of the plurality of second doping regions of the first doping structure include dopants of a second conductivity type with different doping concentrations. At least one first doping region of the plurality of first doping regions of the first doping structure partly overlaps at least one second doping region of the plurality of second doping regions of the first doping structure causing an overlap region arranged at the main surface.

15 Claims, 12 Drawing Sheets

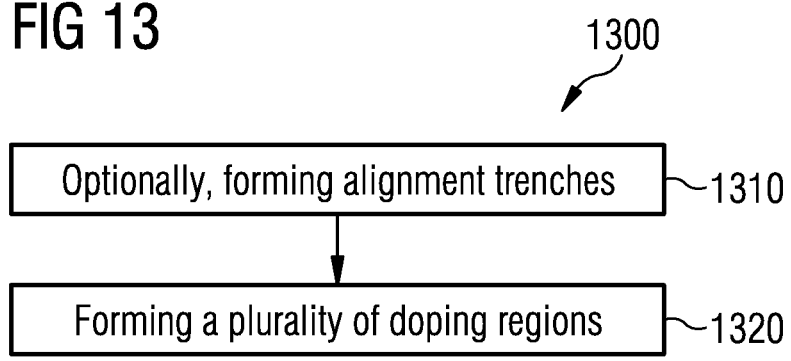
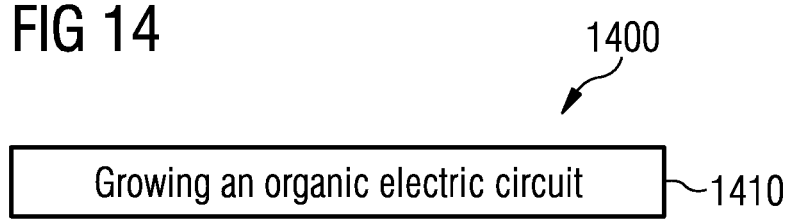

SEMICONDUCTOR DEVICE HAVING AREAS WITH DIFFERENT CONDUCTIVITY TYPES AND DIFFERENT DOPING CONCENTRATIONS

FIELD

Embodiments relate to the doping of semiconductor substrates and in particular to a semiconductor device and a method for forming a semiconductor device.

BACKGROUND

The implementation of different doping structures on a semiconductor substrate is desired for many applications. For example, accurate calibration samples are required for the quantitative determination of doping concentrations with high spatial resolution by scanning capacitance microscopy or spreading resistance analysis. Such calibration samples are often expensive and a time-consuming calibration is necessary.

SUMMARY

Some embodiments relate to a semiconductor device comprising a semiconductor substrate. The semiconductor substrate comprises a plurality of first doping regions of a first doping structure arranged at a main surface of the semiconductor substrate and a plurality of second doping regions of the first doping structure arranged at the main surface of the semiconductor substrate. The first doping regions of the plurality of first doping regions of the first doping structure comprise dopants of a first conductivity type with different doping concentrations. Further, the second doping regions of the plurality of second doping regions of the first doping structure comprise dopants of a second conductivity type with different doping concentrations. At least one first doping region of the plurality of first doping regions of the first doping structure partly overlaps at least one second doping region of the plurality of second doping regions of the first doping structure causing an overlap region arranged at the main surface.

Some further embodiments relate to a method for forming a semiconductor device comprising forming a plurality of doping regions at a main surface of the semiconductor substrate by using the same implant mask repeatedly with a predefined offset.

Some embodiments relate to a method for growing an organic electric circuit comprising growing the organic electric circuit on a main surface of a semiconductor substrate. The semiconductor substrate comprises a plurality of first doping regions arranged at the main surface of the semiconductor substrate. Further, the first doping regions of the plurality of first doping regions comprise dopants of a first conductivity type with different doping concentrations.

BRIEF DESCRIPTION OF THE DRAWINGS

Some embodiments of apparatuses and/or methods will be described in the following by way of example only, and with reference to the accompanying figures, in which

FIG. 13 shows a flow chart of a method for forming a semiconductor device; and FIG. 14 shows a flow chart of a method for growing an organic electric circuit.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
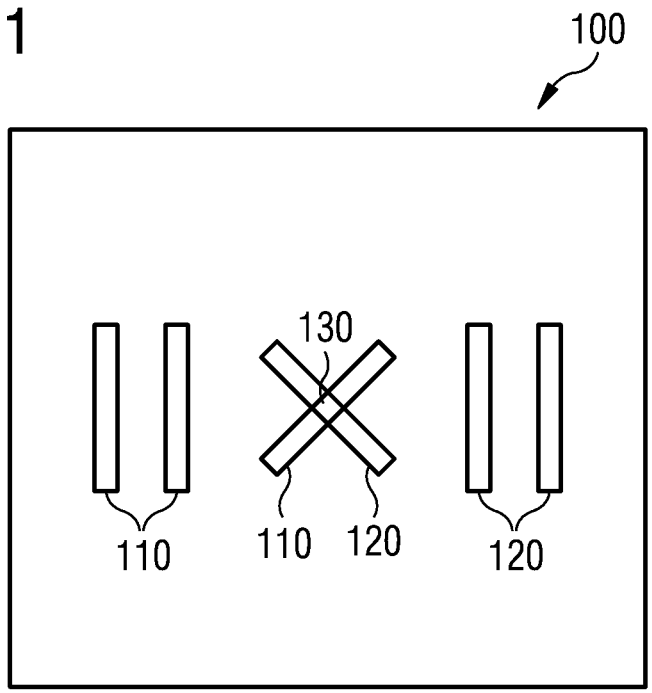
FIG. 1 shows a schematic illustration of a semiconductor device.

FIG. 1 shows a schematic top view of a semiconductor device 100 comprising a semiconductor substrate according to an embodiment. The semiconductor substrate comprises a plurality of first doping regions 110 of a first doping structure arranged at a main surface of the semiconductor substrate and a plurality of second doping regions 120 of the first doping structure arranged at the main surface of the semiconductor substrate. The first doping regions 110 of the plurality of first doping regions 110 of the first doping structure comprise dopants of a first conductivity type with different doping concentrations. Further, the second doping regions 120 of the plurality of second doping regions 120 of the first doping structure comprise dopants of a second conductivity type with different doping concentrations. At least one first doping region 110 of the plurality of first doping regions 110 of the first doping structure partly overlaps at least one second doping region 120 of the plurality of second doping regions 120 of the first doping structure causing or resulting in an overlap region 130 arranged at the main surface.

By implementing a plurality of first doping regions 110 and a plurality of second doping regions 120 as well as at least two crossing doping regions on the same semiconductor substrate, a large variety of areas with different doping concentrations and different pn-junctions can be provided on the same semiconductor device. In this way, a calibration sample for scanning probe devices may be provided enabling a fast and accurate calibration, for example. Alternatively, a substrate for growing organic electric circuits may be provided, for example.

The semiconductor device 100 or semiconductor die may be implemented by any semiconductor processing technology capable of forming the mentioned doping regions, for example. In other words, the semiconductor substrate of the semiconductor device 100 may be a silicon-based semiconductor substrate, a silicon carbide-based semiconductor substrate, a gallium arsenide-based semiconductor substrate or a gallium nitride-based semiconductor substrate, for example.

The plurality of first doping regions 110 and the plurality of second doping regions 120 are arranged or located at the main surface of the semiconductor substrate. In other words, each first doping region 110 of the plurality of first doping regions 110 and each second doping region 120 of the plurality of second doping regions 120 reaches from the main surface of the semiconductor substrate into the semiconductor substrate.

A main surface of the semiconductor substrate may be an at least partly externally accessible semiconductor surface of the semiconductor substrate and/or a semiconductor surface of the semiconductor substrate at least partly located towards metal layers, insulation layers and/or passivation layers on top of the semiconductor surface. In comparison to a basically vertical edge (e.g. resulting from separating the semiconductor substrate from others) of the semiconductor substrate, the main surface of the semiconductor substrate may be a basically horizontal surface extending laterally. The main surface of the semiconductor substrate may be a basically even plane (e.g. neglecting unevenness of the semiconductor structure due to the manufacturing process or trenches). In other words, the main surface of the semiconductor substrate may be a semiconductor surface at least partly accessible for external devices and/or an interface between the semiconductor material and an insulation layer, metal layer or passivation layer on top of the semiconductor substrate. Further, a lateral direction or lateral expansion may be oriented basically in parallel to the main surface and a vertical direction or vertical expansion may be oriented basically orthogonal to the main surface.

The plurality of first doping regions 110 comprise dopants of a first conductivity type (e.g. n or p) and the plurality of second doping regions 120 comprise dopants of a second conductivity type (e.g. p or n). In other words, first doping regions 110 of a doping structure may comprise p-dopants (e.g. caused by implanting aluminum ions or boron ions) and second doping regions 120 of a doping structure may comprise n-dopants (e.g. caused by implanting nitrogen ions, phosphor ions or arsenic ions) or vice versa. In other words, the first conductivity type may indicate a p-doping and the second conductivity type may indicate an n-doping or vice-versa. The semiconductor substrate may comprise a basic doping (n or p). The basic doping of the semiconductor substrate may be lower than the doping concentrations of the plurality of first doping regions 110 and the plurality of second doping regions 120, for example.

Further, the first doping regions 110 of the plurality of first doping regions 110 of the first doping structure comprise different doping concentrations. In other words, a first doping region 110 of the plurality of first doping regions 110 of the first doping structure comprises a dopant concentration different from the concentrations of dopants of the other first doping regions 110 of the plurality of first doping regions 110 of the first doping structure. For example, each first doping region 110 of the plurality of first doping regions 110 of the first doping structure comprises a dopant concentration different from the concentrations of dopants of the other first doping regions 110 of the plurality of first doping regions 110 of the first doping structure.

Correspondingly, a second doping region 120 of the plurality of second doping regions 120 of the first doping structure comprises a dopant concentration different from the concentrations of dopants of the other second doping regions 120 of the plurality of second doping regions 120 of the first doping structure. For example, each second doping region 120 of the plurality of second doping regions 120 of the first doping structure comprises a dopant concentration different from the concentrations of dopants of the other second doping regions 120 of the plurality of second doping regions 120 of the first doping structure.

At least one first doping region 110 of the plurality of first doping regions 110 of the first doping structure partly overlaps at least one second doping region 120 of the plurality of second doping regions 120 of the first doping structure. A partial overlap means that the at least one first doping region 110 and the at least one second doping region 120 comprise a non-overlapping part each. For example, the at least one first doping region 110 may cross the at least one second doping region 120 so that the at least one first doping region 110 comprises a non-overlapping part laterally before crossing the at least one second doping region 120 and laterally after crossing the at least one second doping region 120 as shown in FIG. 1. In other words, the overlap region 130 may be exposed to an implantation of dopants of the at least one first doping region 110 and of the at least one second doping region 120.

The at least one first doping region 110 comprises the first conductivity type in the non-overlapping part of the at least one first doping region 110 and the at least one second doping region 120 comprises the second conductivity type in the non-overlapping part of the at least one second doping region 120.

The doping type of the overlap region 130 depends on the doping concentrations of the crossing doping regions. For example, if the at least one first doping region 110 comprises a higher concentration of dopants of the first conductivity type than a concentration of dopants of the second conductivity type within the at least one second doping region 120, the resulting overlap region 130 comprises the first conductivity type and vice versa (e.g. neglecting a basic doping of the semiconductor substrate). Further, an effective doping concentration within the overlap region 130 may depend on the concentration of dopants of the first conductivity type of the at least one first doping region 110 and the concentration of dopants of the second conductivity type of the at least one second doping region 120, for example. Depending on the resulting conductivity type of the overlap region 130, a pn-junction is obtained at a border towards the non-overlapping part of the first doping region 110 or the second doping region 120.

Optionally, the at least one first doping region 110 may partly overlap more than one second doping region 120. For example, the at least one first doping region 110 of the plurality of first doping regions 110 of the first doping structure may partly overlap each second doping region 120 of the plurality of second doping regions 120 of the first doping structure causing a plurality of overlap regions 130 arranged at the main surface. In this way, the variety of different doping concentrations and/or pn-junctions accessible at the main surface may be further increased.

Further, more than one first doping region 110 may cross each second doping region 120. For example, each first doping region 110 of the plurality of first doping regions 110 of the first doping structure may optionally partly overlap each second doping region 120 of the plurality of second doping regions 120 of the first doping structure causing a plurality of overlap regions arranged at the main surface. In this way, the variety of different doping concentrations and/or pn-junctions accessible at the main surface may be further increased.

The first doping regions 110 and the second doping regions 120 may comprise an arbitrary shape at the main surface as long as at least one doping region of each plurality of doping regions partly overlaps the other. For example, some or all doping regions may comprise a rectangular-shaped geometry (e.g. neglecting rounded corners due to manufacturing effects), a square-shaped geometry, a strip-shaped geometry or a line-shaped geometry. For example, a strip-shaped geometry or rectangular-shaped geometry may be used for a first doping region 110 overlapping partly several second doping regions 120 and vice versa. A strip-shaped geometry may be a geometry comprising a significantly larger (e.g. more than 2 times, more than 5 times or more than 10 times larger) dimension in a first lateral direction than in a second orthogonal direction, for example.

For example, the first doping regions 110 (e.g. some or all) of the plurality of first doping regions 110 of the first doping structure and/or the second doping regions 120 (e.g. some or all) of the plurality of second doping regions 120 of the first doping structure may comprise a strip-shaped geometry at the main surface (e.g. FIG. 1).

Optionally, a shape and/or a dimension of some or all first doping regions 110 and/or some or all second doping regions 120 may be basically equal (e.g. neglecting variations due to manufacturing processes).

The first doping regions 110 and the second doping regions 120 may be arranged arbitrarily at the main surface as long as at least one doping region of each plurality of doping regions partly overlaps the other. For example, some or all doping regions may be strip-shaped and may be arranged basically in parallel or orthogonal (e.g. neglecting variations due to manufacturing processes) to other doping regions of the first doping structure. For example, the first doping regions 110 of the plurality of first doping regions 110 (e.g. some or all) of the first doping structure may be arranged basically in parallel to each other at the main surface (e.g. a direction of a maximal extension of the doping regions may be in parallel). Additionally, the second doping regions 120 (e.g. all or some) of the plurality of second doping regions 120 of the first doping structure may be optionally arranged basically orthogonal to the first doping regions 110 (e.g. some or all) of the plurality of first doping regions 110 of the first doping structure at the main surface. Alternatively, the second doping regions 120 (e.g. all or some) of the plurality of second doping regions 120 of the first doping structure may be optionally arranged with a predefined angle (e.g. between 45° and 135° or between 75° and 105°) to the first doping regions 110 (e.g. some or all) of the plurality of first doping regions 110 of the first doping structure at the main surface. In this way, a single strip-shaped first doping region 110 can overlap partly several second doping regions 120, for example.

The distance between parallel arranged neighboring doping regions may be less than a maximal dimension (e.g. length of a strip-shaped doping region) of the neighboring doping regions or less than 5 times (or less than 2 times or less than one time) a width of the neighboring doping regions (e.g. measured orthogonal to a maximal dimension).

The semiconductor substrate may comprise one or more doping structures arranged at the main surface. A doping structure may comprise a plurality of different doping regions (e.g. first and second doping regions described above) with a common or interrelated geometric and/or arrangement relation, for example. Different doping structures may comprise different numbers of doping regions, differently shaped doping regions and/or doping regions with different doping concentrations, for example.

Optionally, additionally or alternatively to one or more aspects mentioned above, the semiconductor device 100 may further comprise a plurality of first doping regions of a second doping structure arranged at the main surface of the semiconductor substrate. The first doping regions of the plurality of first doping regions of the second doping structure may comprise the first conductivity type with different doping concentrations. In other words, the first doping regions of the plurality of first doping regions of the second doping structure may be arranged without a partial overlap (e.g. keeping the possibility of a complete overlap with a basic doping of the semiconductor substrate) with a doping region comprising dopants of the second conductivity type, for example. In this way, a sequence of regions with different doping concentrations may be provided.

For example, the first doping regions of the plurality of first doping regions of the second doping structure may optionally comprise a strip-shaped geometry at the main surface. Further, the first doping regions of the plurality of first doping regions of the second doping structure may be optionally arranged basically in parallel (e.g. neglecting variations due to manufacturing processes) to each other at the main surface. The distance between parallel arranged neighboring doping regions may be less than a maximal dimension (e.g. length of a strip-shaped doping region) of the neighboring doping regions or less than 5 times (or less than 2 times or less than one time) a width of the neighboring doping regions (e.g. measured orthogonal to a maximal dimension).

Additionally, the second doping structure may comprise a plurality of second doping regions comprising the second conductivity type. The plurality of second doping regions may be strip-shaped and arranged in parallel to the plurality of first doping regions of the second doping structure, for example.

Optionally, additionally or alternatively to one or more aspects mentioned above, the semiconductor device 100 may further comprise a plurality of filled trenches arranged in parallel to each other and a plurality of first doping regions of a third doping structure. The first doping regions of the plurality of first doping regions of the third doping structure may comprise the first conductivity type with different doping concentrations. Each first doping region of the plurality of first doping regions of the third doping structure may basically orthogonally cross the filled trenches (e.g. some or all) of the plurality of filled trenches. The trenches may be filled at least mainly by an insulating material (e.g. silicon oxide) or another non-semiconductor material. The evenness of the main surface may be improved by completely filling the trenches, for example. In this way, an alternating structure of doped semiconductor material and non-semiconductor material including a variation of the doping of the doped semiconductor material may be provided.

Additionally, the third doping structure may comprise a plurality of second doping regions comprising the second conductivity type. The plurality of second doping regions may be strip-shaped and arranged in parallel to the plurality of first doping regions of the third doping structure, for example.

Optionally, additionally or alternatively to one or more aspects mentioned above, the semiconductor device 100 may further comprise a plurality of first and/or second doping regions of a further doping structure. The doping regions of the further doping structure may comprise also different doping concentrations and may occupy a larger area (e.g. more than two times, more than 5 times or more than 10 times larger) of the main surface than the doping regions of the first doping structure. For example, large doping regions may be used for comparison of calibrations using secondary ion mass spectrometry (SIMS).

Figure 2:
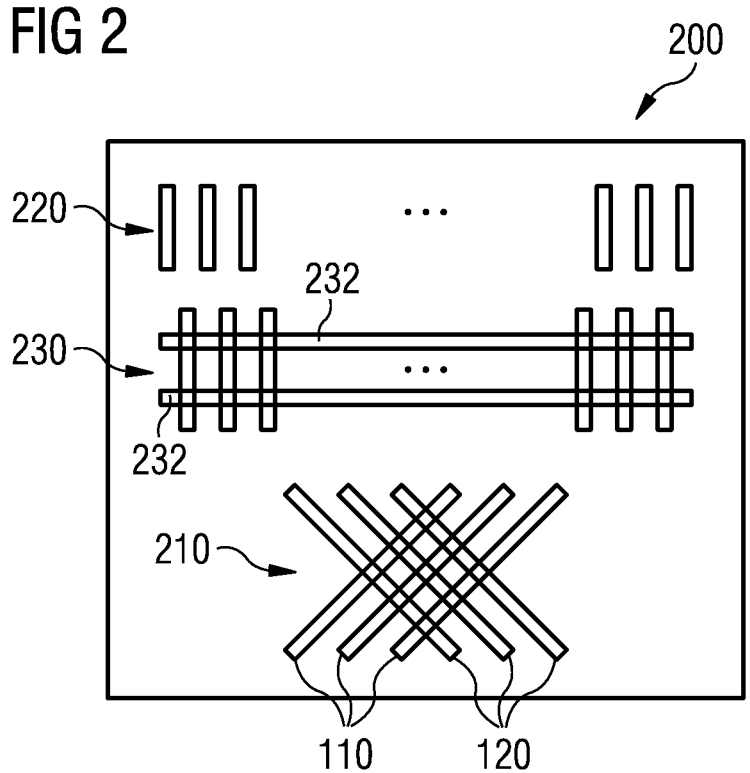
FIG. 2 shows a schematic illustration of a further semiconductor device.

FIG. 2 shows a schematic top view of a semiconductor device 200 comprising a semiconductor substrate according to an embodiment. The implementation of the semiconductor device 200 is similar to the implementation shown in FIG. 1. The semiconductor substrate comprises a first doping structure 210 with partly overlapping doping regions, a second doping structure 220 with a plurality of first doping regions and a third doping structure 230 with doping regions crossing filled trenches 232. More details and aspects are described in connection with the embodiments described above.

The semiconductor device 200 may comprise one or more additional doping structures similar to the first, second and/or third doping structure comprising a different number of different doping regions, for example.

Optionally, additionally or alternatively to one or more aspects mentioned above, the first doping regions of the plurality of first doping regions of the first doping structure and the second doping regions of the plurality of second doping regions of the first doping structure (and optionally, the doping regions of the second and/or third doping structures) are at least partly externally accessible at the main surface. In other words, at least a part of each first doping region of the plurality of first doping regions and at least a part of each second doping region of the plurality of second doping regions may stay uncovered so that the main surface is at least partly externally accessible. In this way, at least a part of each doping region may be accessible by a scanning probe device or for growing an organic electric circuit, for example.

Optionally, additionally or alternatively to one or more aspects mentioned above, the semiconductor device may comprise at least one metal layer electrically connecting at least one first doping region to a pad. In this way, the at least one first doping region can be connected to an external device. For example, a bias voltage can be applied to the at least one first doping region through the pad in order to influence a calibration of a scanning probe device or the growth of an organic electric circuit.

For example, one or more metal layers may be implemented for providing electrically conductive lines connecting some or all first doping regions of the plurality of first doping regions of the first doping structure, some or all second doping regions of the plurality of second doping regions of the first doping structure, some or all first doping regions of the plurality of first doping regions of the second doping structure and/or some or all first doping regions of the plurality of first doping regions of the third doping structure to individual pads or at least partly common pads.

Optionally, additionally or alternatively to one or more aspects mentioned above, the semiconductor device may comprise a back side metal layer in contact with a back side surface of the semiconductor substrate (opposite to the main surface). In this way, a reference potential (e.g. ground) can be applied to the back side of the semiconductor substrate, for example.

Optionally, additionally or alternatively to one or more aspects mentioned above, the semiconductor device may comprise at least one (at least partly) filled alignment trench arranged in the proximity of a first doping region. In this way, an optically visible (e.g. by bare eye or microscope) structure can be placed close to the first doping region so that the location of the first doping region may be easily found, for example. For example, the filled alignment trench may be located in the proximity of the first doping region, if a distance between the first doping region and the filled alignment trench is less than 5 times (or less than 2 times or less than one time) a maximal dimension of the first doping region (e.g. length of a strip-shaped doping region).

The filled alignment trench may comprise an arbitrary shape (e.g. cross-shaped, rectangular-shaped, circular-shaped or square shaped) and arbitrary size (e.g. larger than 1 μm and smaller than 100 μm).

Similarly, filled alignment trenches may be placed close to further doping regions. For example, the semiconductor device may comprise a plurality of alignment trenches. Each alignment trench of the plurality of alignment trenches may be arranged in the proximity of a first doping region or a second doping region.

Figure 3:
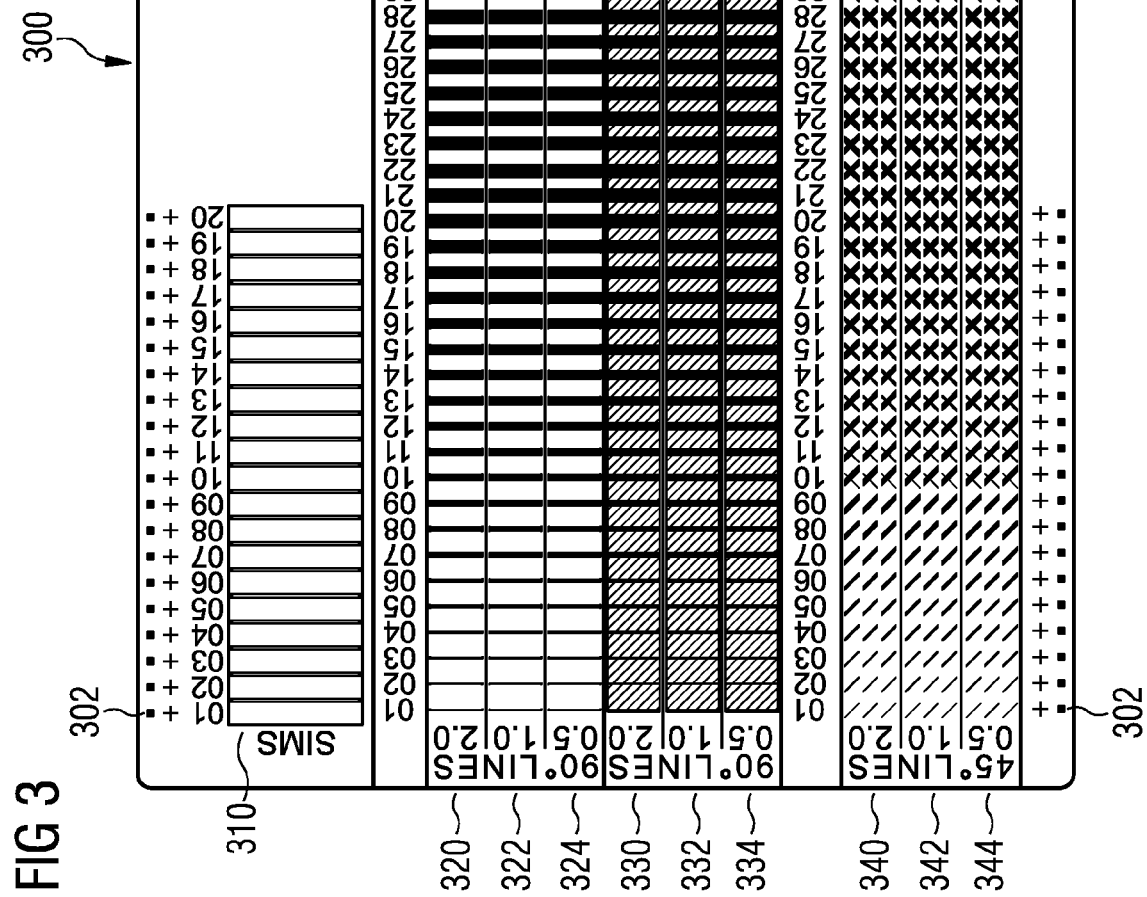
FIG. 3 shows a schematic illustration of a further semiconductor device.

FIG. 3 shows a schematic top view of a semiconductor device 300 comprising a semiconductor substrate according to an embodiment. The implementation of the semiconductor device 300 is similar to the implementation shown in FIG. 1 and FIG. 2, for example. The semiconductor substrate comprises a plurality of doping structures with various geometries and/or shapes. The doping structures comprise a varying number of first and/or second doping regions. For example, doping structures comprise between one first doping region and no second doping region up to ten first doping regions and ten second doping regions and down to no first doping region and one second doping region.

One doping structure 310 of the semiconductor substrate comprises large doping regions for secondary ion mass spectrometry (SIMS). The doping structure 310 may comprise one first doping region for each different doping concentration of dopants of the first conductivity type (e.g. indicated by 1-10) and one second doping region for each different doping concentration of dopants of the second conductivity type (e.g. indicated by 11-20) arranged in one row, for example.

A further row 320 comprises a plurality of doping structures similar to the second doping structures mentioned above with a varying number of strip-shaped first and/or second doping regions with a first predefined width (e.g. 2.0 μm).

A further row 322 comprises a plurality of doping structures similar to the second doping structures mentioned above with a varying number of strip-shaped first and/or second doping regions with a second predefined width (e.g. 1.0 μm).

A further row 324 comprises a plurality of doping structures similar to the second doping structures mentioned above with a varying number of strip-shaped first and/or second doping regions with a third predefined width (e.g. 0.5 µm).

A further row 330 comprises a plurality of doping structures similar to the third doping structures mentioned above with a varying number of strip-shaped first and/or second doping regions with a first predefined width (e.g. 2.0 µm).

A further row 332 comprises a plurality of doping structures similar to the third doping structures mentioned above with a varying number of strip-shaped first and/or second doping regions with a second predefined width (e.g. 1.0 µm).

A further row 334 comprises a plurality of doping structures similar to the third doping structures mentioned above with a varying number of strip-shaped first and/or second doping regions with a third predefined width (e.g. 0.5 µm).

A further row 340 comprises a plurality of doping structures similar to the first doping structures mentioned above with a varying number of strip-shaped first and/or second doping regions with a first predefined width (e.g. 2.0 µm).

A further row 342 comprises a plurality of doping structures similar to the first doping structures mentioned above with a varying number of strip-shaped first and/or second doping regions with a second predefined width (e.g. 1.0 µm).

A further row 344 comprises a plurality of doping structures similar to the first doping structures mentioned above with a varying number of strip-shaped first and/or second doping regions with a third predefined width (e.g. 0.5 µm).

Further, the semiconductor substrate comprises optically visible filled trenches indicating numbers in the proximity of the doping regions and/or doping structures enabling an identification of the locations of the various doping regions and/or doping structures.

Additionally, the semiconductor substrate comprises a plurality of mask alignment trenches 302 close to an edge of the semiconductor substrate for enabling an alignment of masks during manufacturing, for example.

FIG. 3 may be a layout after final processing. The semiconductor device 300 may comprise one or more additional optional features corresponding to one or more aspects mentioned in connection with the described concept or one or more embodiments described above.

Figure 4:
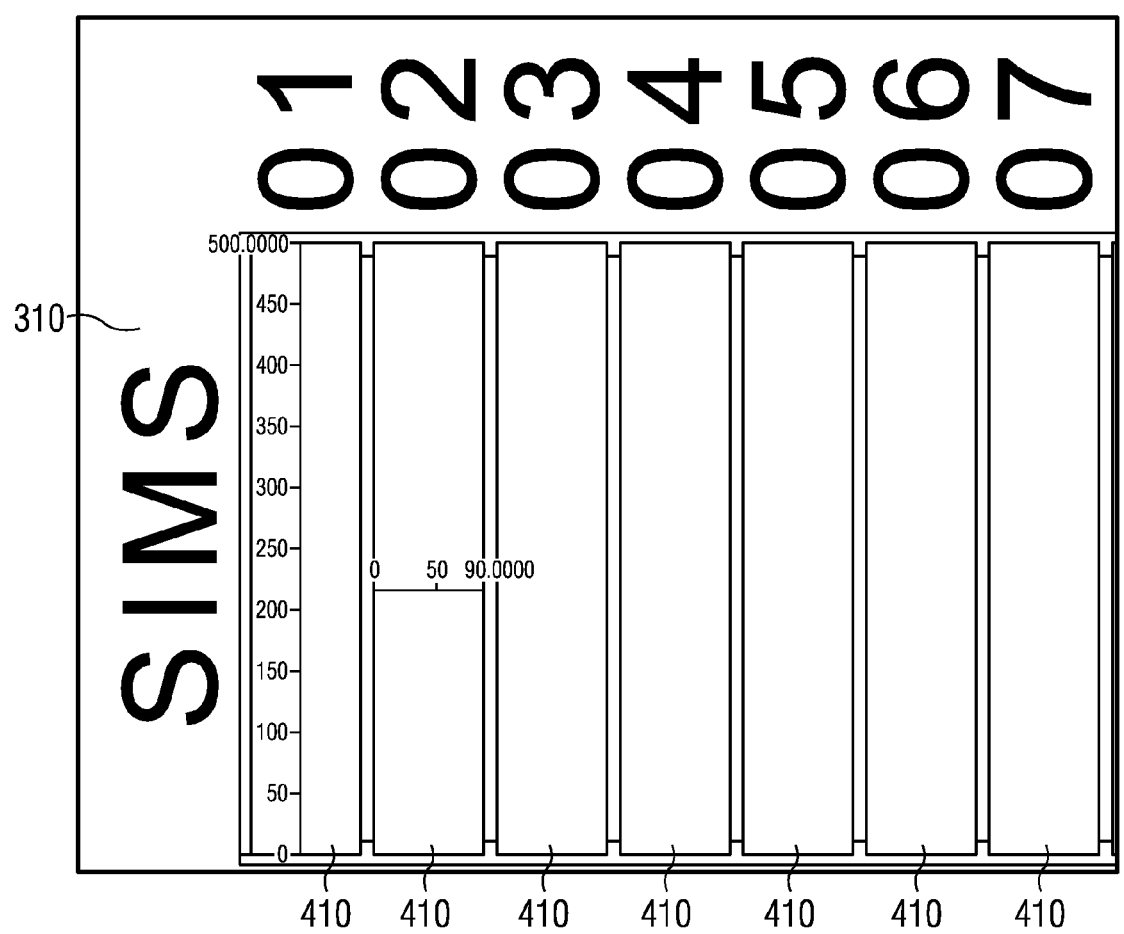
FIGS. 4-8 show schematic details of the semiconductor device shown in FIG. 3.

FIG. 4 shows a schematic detail of the semiconductor device 300 shown in FIG. 3. A detail (SIMS) of seven doping regions of the doping structure 310 with large doping regions is illustrated. The doping regions may occupy an area of the main surface of the semiconductor substrate of 90 µm by 500 µm with a distance of 10 µm in between, for example.

Figure 5:
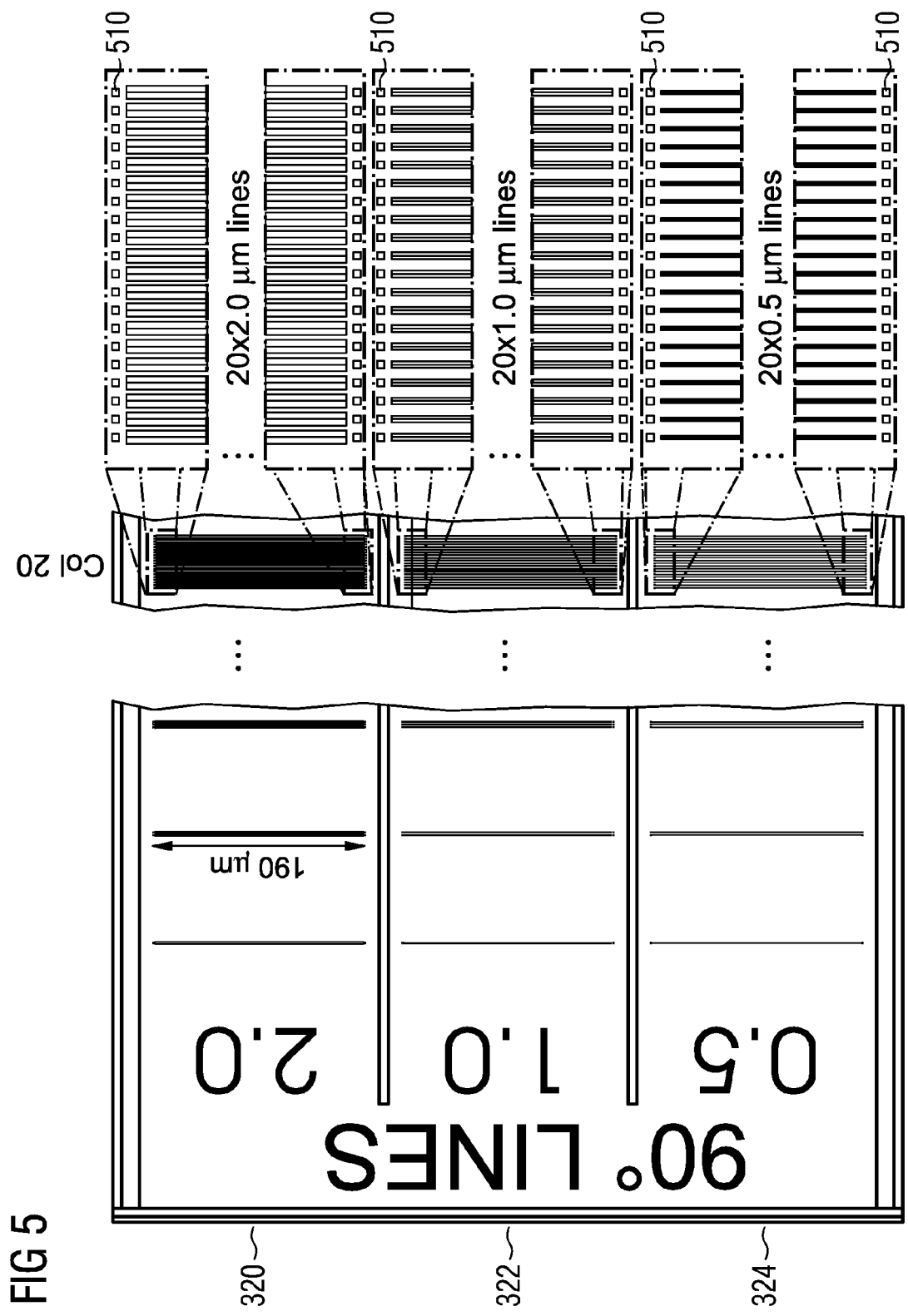

FIG. 5 shows a schematic detail of the semiconductor device 300 shown in FIG. 3. A detail (lines w/o trench underground) of the rows 320, 322, 324 comprising doping structures similar to the second doping structure mentioned above is illustrated. The strip-shaped doping regions comprise a length of 190 µm and a width of 2 µm, a length of 190 µm and a width of 1 µm or a length of 190 µm and a width of 0.5 µm representing lines oriented by 90° to a reference direction, for example. Column 20 comprises doping structures with 20 doping regions (lines), for example. Further, alignment trenches 510 (e.g. square shaped) are located in the proximity of both ends of each doping region, for example.

Figure 6:
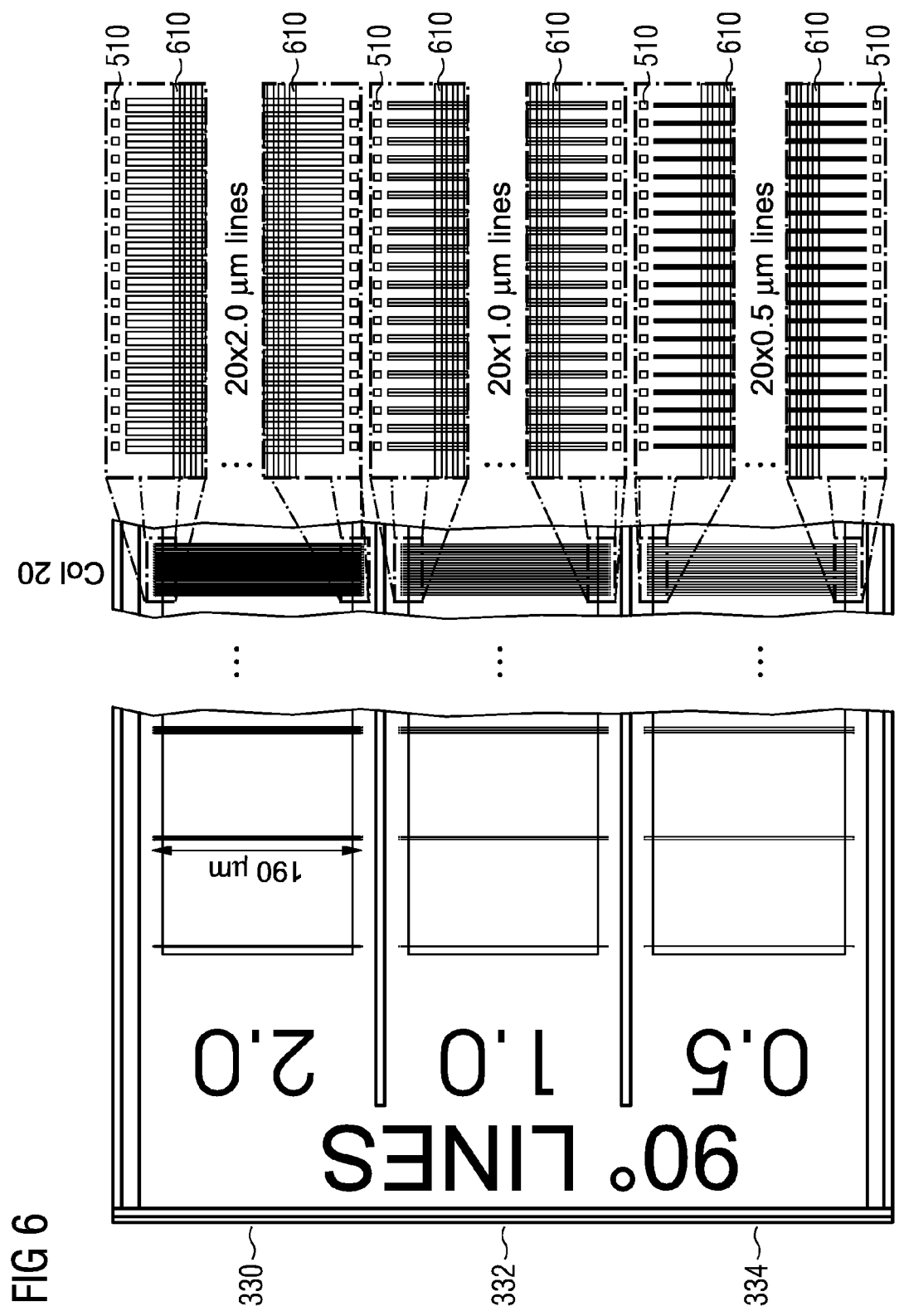

FIG. 6 shows a schematic detail of the semiconductor device 300 shown in FIG. 3. A detail (lines with trench underground) of the rows 330, 332, 334 comprising doping structures similar to the third doping structure mentioned above is illustrated. The strip-shaped doping regions comprise a length of 190 µm and a width of 2 µm, a length of 190 µm and a width of 1 µm or a length of 190 µm and a width of 0.5 µm representing lines oriented by 90° to a reference direction, for example. Column 20 comprises doping structures with 20 doping regions, for example. Further, a plurality of strip-shaped filled trenches 610 is arranged orthogonal to the doping regions. Further, alignment trenches 510 (e.g. square shaped) are located in the proximity of both ends of each doping region, for example.

Figure 7:
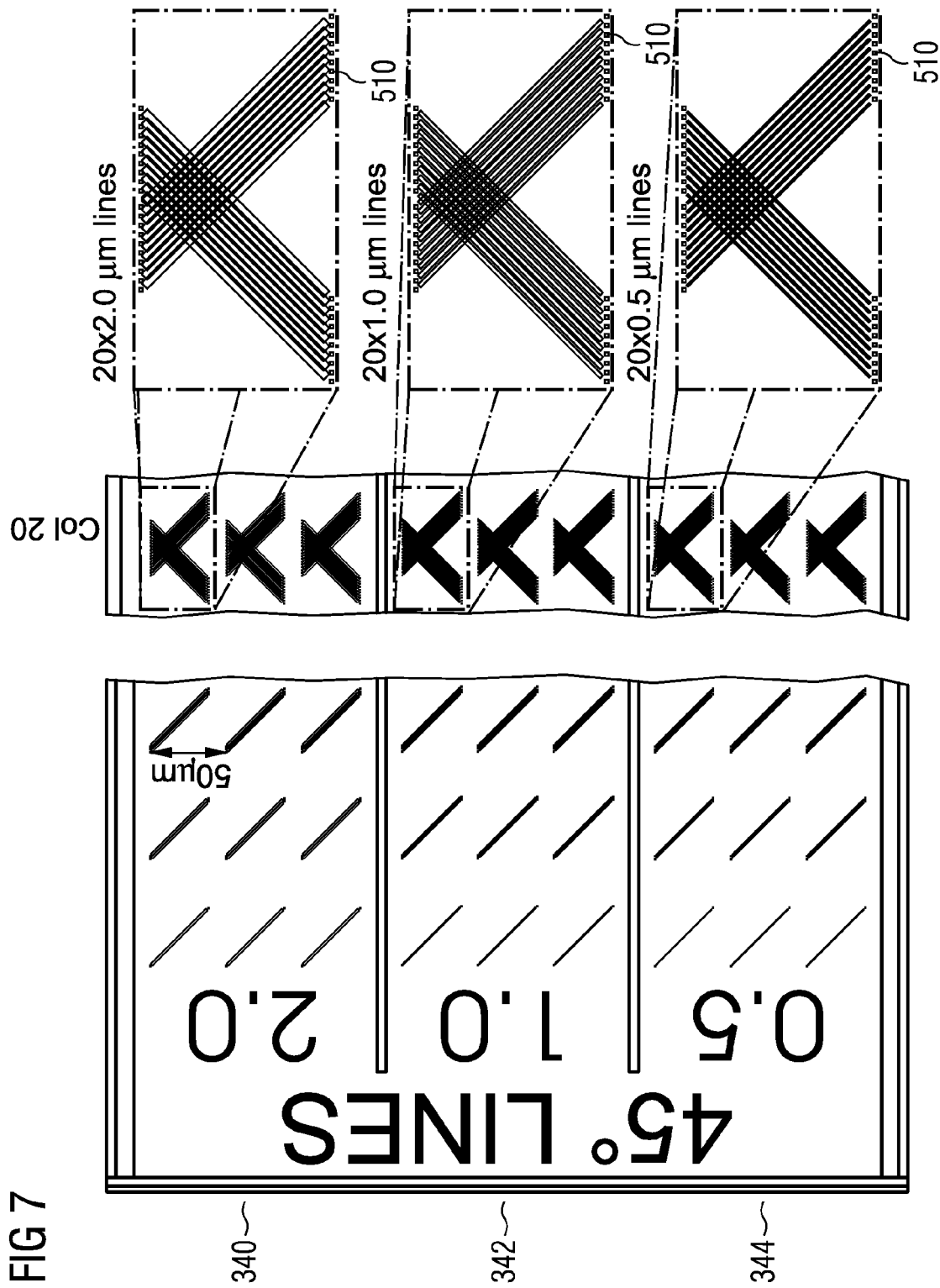

FIG. 7 shows a schematic detail of the semiconductor device 300 shown in FIG. 3. A detail (diagonal lines) of the rows 340, 342, 344 comprising doping structures similar to the first doping structure mentioned above is illustrated. The strip-shaped doping regions comprise a width of 2 µm, a width of 1 µm or a width of 0.5 µm representing lines oriented by 45° to a reference direction comprising an extension in the 90° direction of 50 µm, for example. Column 20 comprises doping structures with 20 doping regions, for example. Further, alignment trenches 510 (e.g. square shaped) are located in the proximity of both ends of each doping region, for example.

Figure 8:
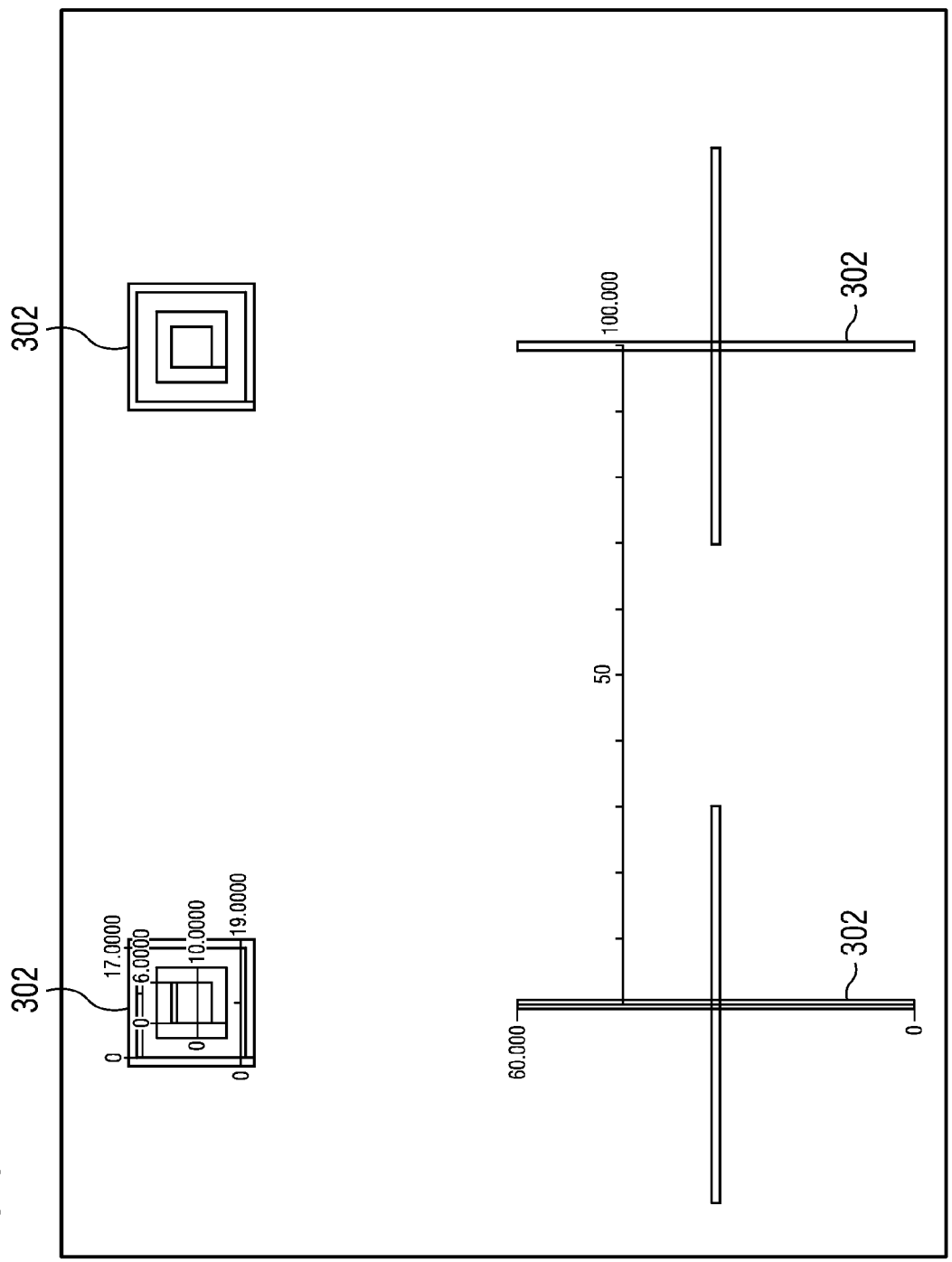

FIG. 8 shows a schematic detail of the semiconductor device 300 shown in FIG. 3. A detail (alignment/overlay) illustrating mask alignment trenches 302 located close to an edge of the semiconductor substrate for enabling an alignment of masks during manufacturing is illustrated. A cross-shaped mask alignment trench with two crossing lines of 60 µm length and a distance of 100 µm to a neighboring cross-shaped mask alignment trench is shown. Further, square-shaped mask alignment trenches with a 2 µm inner trench ring building up a square of 10 µm by 10 µm and a 1 µm outer trench ring building up a square of 19 µm by 19 µm are shown.

A semiconductor device according to the proposed concept or an embodiment described above may be formed or manufactured in various ways.

Figure 9:
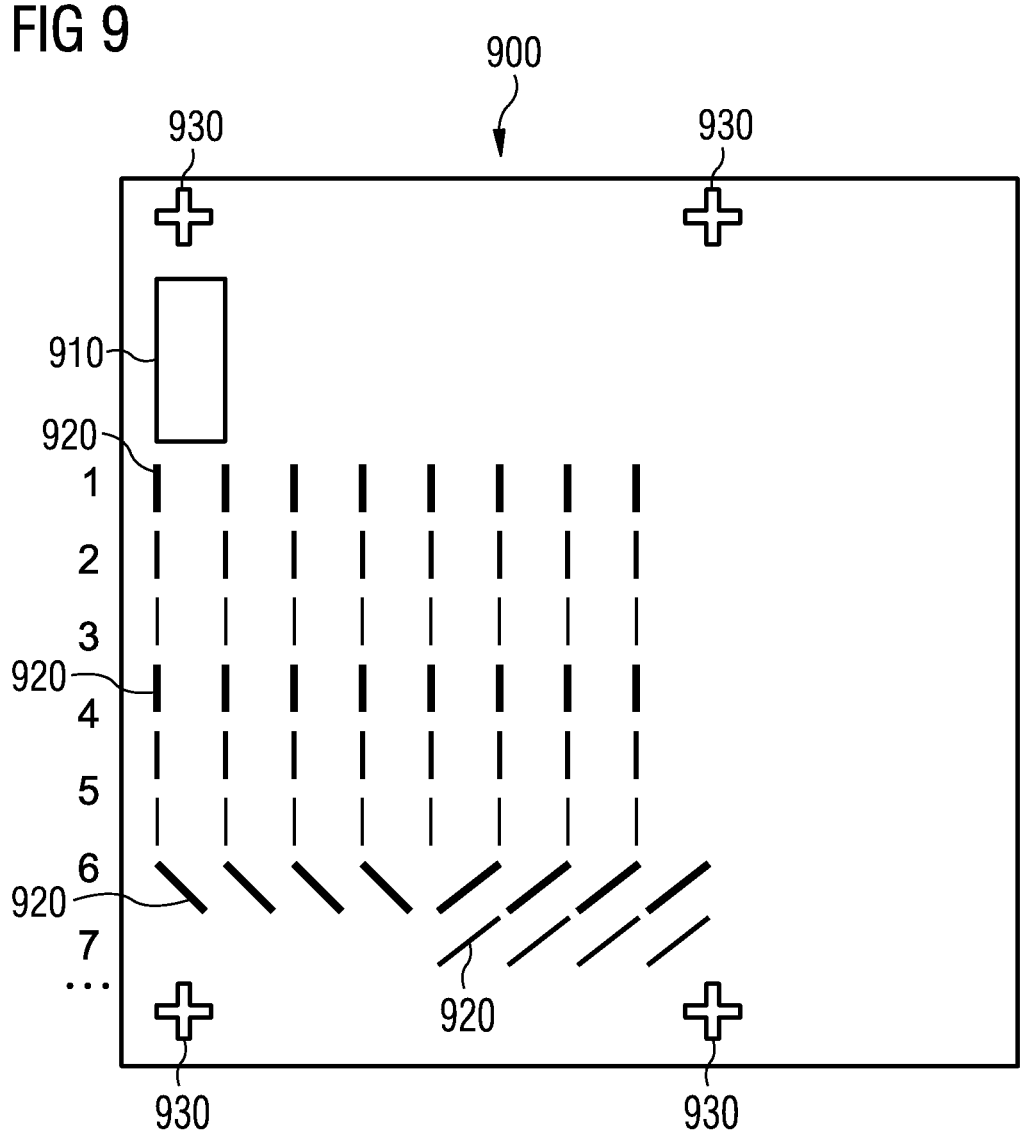
FIG. 9 shows a schematic illustration of an implant mask for a semiconductor device.

FIG. 9 shows a schematic illustration of an implant mask 900 for a semiconductor device according to an embodiment. The implant mask 900 comprises structures for implanting strip-shaped doping regions 920 (e.g. with a width of 2, 1 and 0.5 µm and a period of 97.5 µm) of doping structures arranged in rows 1-7 or more, a large doping region 910 (e.g. 90 µm×500 µm for SIMS) and mask alignment trenches 930, for example. The implant mask 900 may be used repeatedly with a predefined lateral offset (e.g. stepping implant mask by 100 µm) in order to form a plurality of doping regions for a plurality of doping structures, for example.

Figure 10:
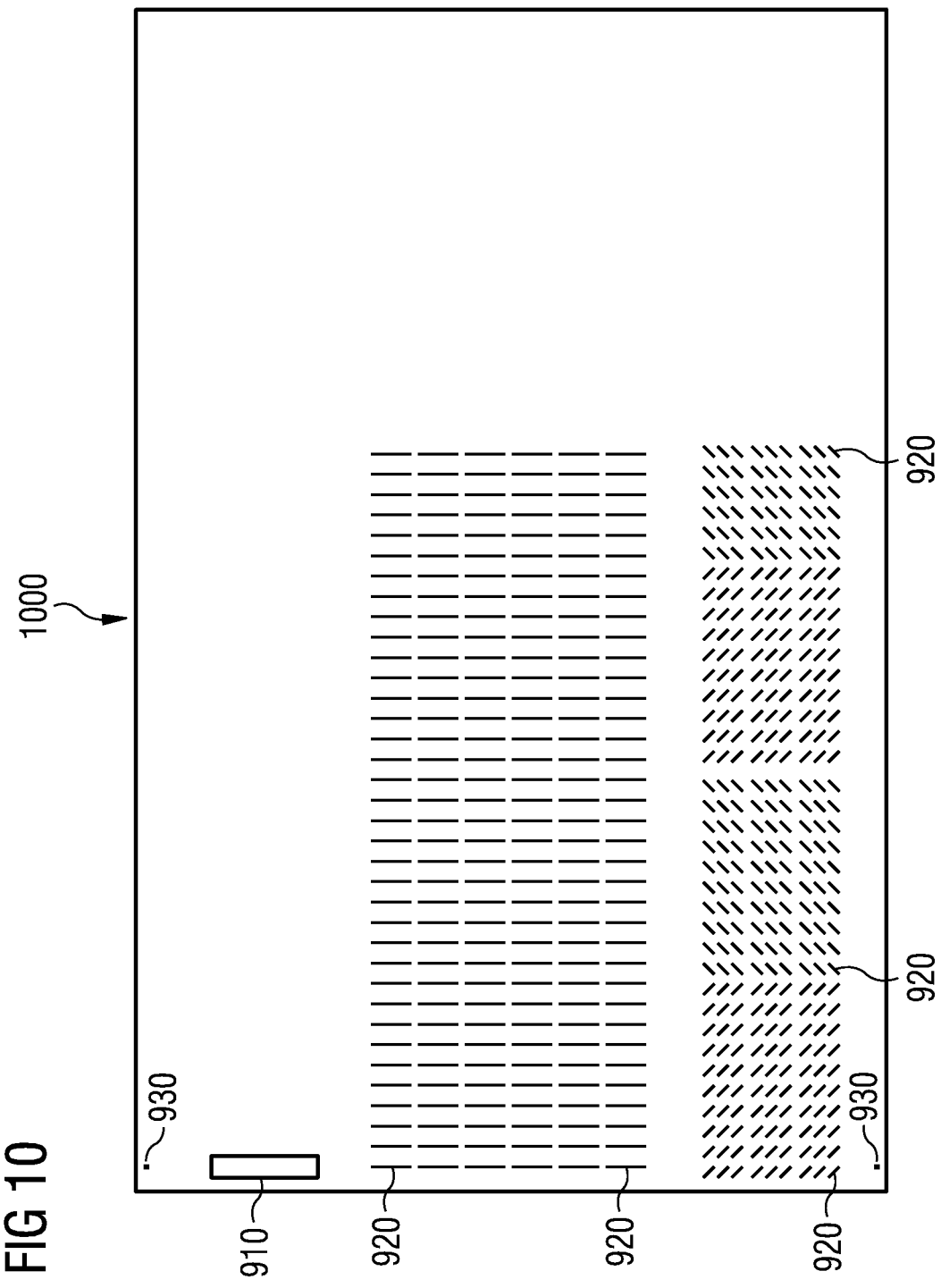
FIG. 10 shows a schematic illustration of a further implant mask for a semiconductor device.

FIG. 10 shows an schematic illustration of an implant mask 1000 for a semiconductor device according to an embodiment. The implant mask 1000 comprises structures for implanting strip-shaped doping regions 920 of doping structures arranged in rows, a large doping region 910 (e.g. for SIMS) and mask alignment trenches 930, for example. The implant mask 1000 may be used repeatedly with a predefined lateral offset in order to form a plurality of doping regions for a plurality of doping structures, for example. The implant mask may be used for forming a semiconductor device as shown in FIG. 3, for example. FIG. 10 may be an overview of an N0 (sdn) implantation reticle, for example.

Figure 11:
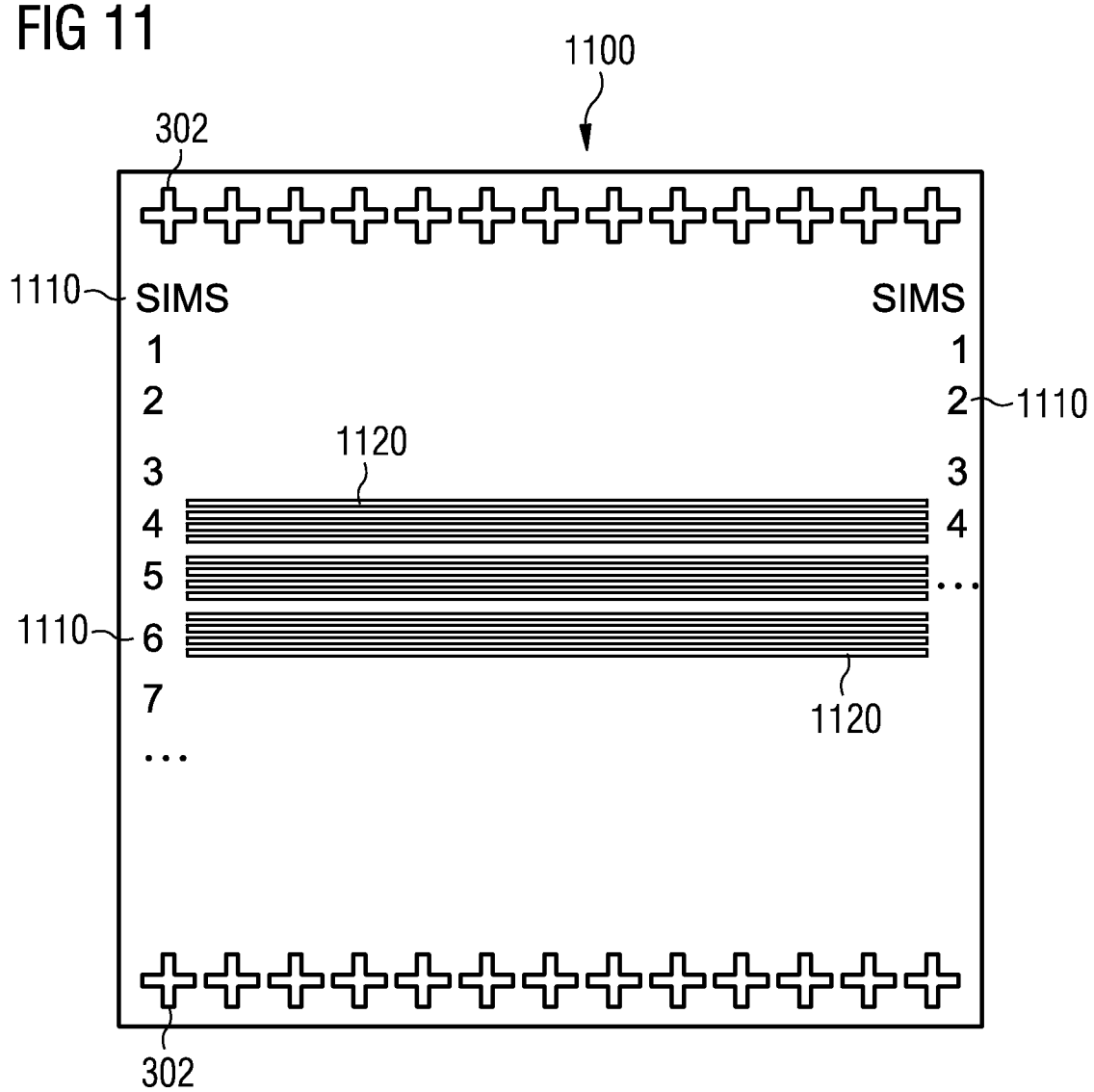
FIG. 11 shows a schematic illustration of a trench mask for a semiconductor device.

FIG. 11 shows a schematic illustration of a trench mask 1100 for a semiconductor device according to an embodiment. The trench mask 1100 comprises structures for implanting alignment crosses 302 (e.g. with a distance of 100 µm), labeling trenches 1110 and a plurality of parallel filled trenches 1120 similar to the trenches of the third doping structure mentioned above (e.g. with a width of 5 µm and a distance of 10 µm), for example.

Figure 12:
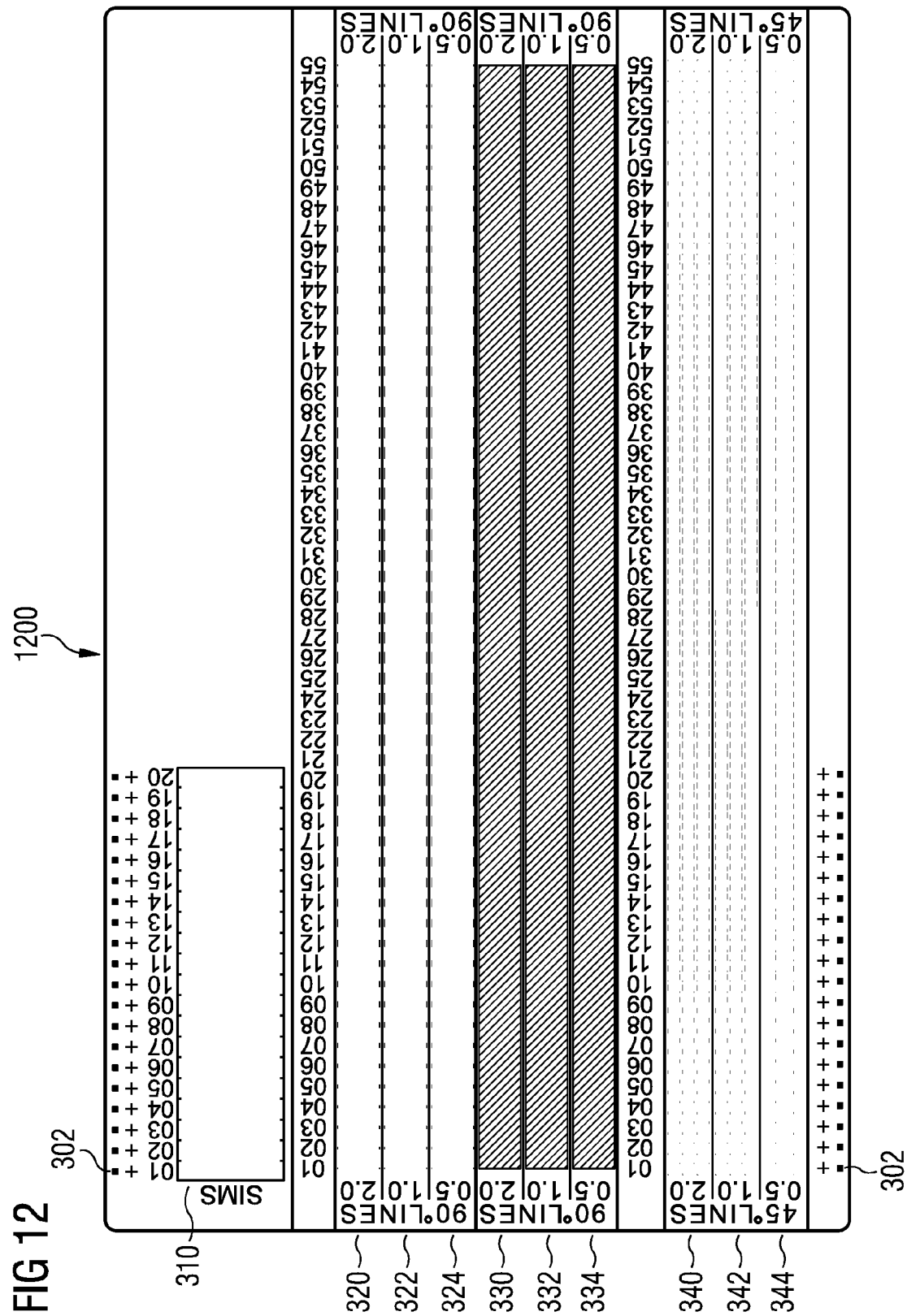
FIG. 12 shows a schematic illustration of a further trench mask for a semiconductor device.

FIG. 12 shows a schematic illustration of a trench mask 1200 for a semiconductor device according to an embodiment. The trench mask 1200 comprises structures for implanting alignment trenches 302, labeling trenches for rows 320-344 and a plurality of parallel filled trenches for three rows 330, 332, 334, for example. The trench mask 1200 may be used for forming a semiconductor device as shown in FIG. 3, for example. FIG. 12 may show an overview of an X0 (trench) reticle, for example.

FIG. 13 shows a flow chart of a method 1300 for forming a semiconductor device according to an embodiment. The method 1300 comprises forming 1320 a plurality of doping regions at a main surface of the semiconductor substrate by using the same implant mask repeatedly with a predefined offset.

By using the same mask repeatedly, the semiconductor device can be formed very fast and cost efficient.

The implant mask is used repeatedly with a predefined offset. In other words, the implant mask may be shifted laterally between two succeeding implant acts for implementing different doping regions by a predefined offset or distance. The predefined offset (e.g. between 50 µm and 500 µm) may be selected depending on the size of the doping regions to be implanted and/or a number of doping regions, for example. The predefined offset between succeeding implant acts may be constant and oriented in the same direction for the whole sequence of implant acts forming the plurality of doping regions, for example.

The plurality of doping regions may be a plurality of first doping regions and/or a plurality of second doping regions of one or more doping structures mentioned in connection with the described concept or one or more embodiments described above.

The implant dose or dopant concentration used for different offsets may be different in order to implement doping regions with different concentration of dopants. In other words, forming the plurality of doping regions may comprise forming a plurality of first doping regions at a main surface of the semiconductor substrate by using the same implant mask repeatedly with a predefined offset and different doping concentrations so that the first doping regions of the plurality of first doping regions comprise dopants of a first conductivity type with different doping concentrations, for example.

It may be sufficient to use only one implant mask for forming all desired doping regions on the semiconductor substrate due to the repeatedly usage of the same implant mask. In other words, optionally, all structures of the semiconductor device formed by implantation of dopants may be formed by using only the one implant mask.

Optionally, the method may further comprise forming 1310 filled alignment trenches into the semiconductor substrate by using a trench mask.

Further, doping regions reaching deep into the semiconductor substrate may be implemented by implanting dopants with more than one energy. In other words, at least one doping region of the plurality of first doping regions is formed by implanting dopants with different doping energies.

The method 1300 may comprise one or more additional optional acts corresponding to one or more aspects mentioned in connection with the described concept or one or more embodiments described above.

FIG. 14 shows a flow chart of a method 1400 for growing an organic electric circuit according to an embodiment. The method 1400 comprises growing 1410 an organic electric circuit on a main surface of a semiconductor substrate. The semiconductor substrate comprises a plurality of first doping regions arranged at the main surface of the semiconductor substrate. The first doping regions of the plurality of first doping regions comprise dopants of a first conductivity type with different doping concentrations.

By using a semiconductor substrate with doping regions comprising different doping concentrations, the growth of elements of an organic electric circuit may be influenced by the doping concentration of the respective doping region, for example.

The method 1400 may comprise one or more additional optional acts corresponding to one or more aspects mentioned in connection with the described concept or one or more embodiments described above.

Some embodiments relate to a calibration sample for a scanning probe device (e.g. scanning capacitance microscopy or spreading resistance microscope). In other words, a semiconductor device or semiconductor die according to the described concept or an embodiment described above may implement a calibration sample for a calibration of a scanning probe device.

For example, a doping calibration sample may comprise a chip size of 5 mm×5 mm (or between 1 mm×1 mm and 10 mm×10 mm) and a substrate doping (basic doping) of p<1e15 $cm^3$. Further, a trench mask may be used for implementing alignment marks, labeling and edges and an implant mask may be used for implementing marking crosses, SIMS-areas and the strip pattern (e.g. representing a mask for doping calibration). The implant mask may be stepped (shifted by a predefined offset) for the p and n implant steps. For example, doping regions with dopant concentrations of 4e15, 1e16, 4e16, 1e17, 4e17, 1e18, 4e18, 1e19, 4e19 and 1e20 for n-type and p-type may be implemented.

Some embodiments relate to a crossed pn-structure for calibration standards. Many functions may be implemented on the same sample piece and the insertion of the one sample piece may be sufficient in order to enable measurement of all dopant levels of the n-type and the p-type sequence and also of the crossed regions of all pn-transition combinations at a spacially very limited area, for example. A calibration sample may be implemented according to the proposed concept or an embodiment described above. Such a calibration sample may combine several functions as large-area SIMS areas for calibration comparison and/or adjustment with other standards, many strip widths alternatives for measuring a bulk doping (e.g. in the middle of a broad strip) and for lateral diffusion (e.g. within small strips), 10 different dopant levels of n-type and p-type, for example, dopant stripes crossing trench stripes in order to calibrate trench/mesa doping and their dilution effect and n-type stripes crossing p-type stripes of all 10 dopant combination in order to measure all kinds of n+ versus p− or p+ to n− pn-junctions, for example.

Additionally, samples may be formed by only one marking photo technique (using one trench mask) and one further mask (implant mask), which is used repeatedly for implantation of the corresponding regions and is stepped from implant to implant by a predefined offset.

In comparison to calibration samples only comprising homogenous p-type or n-type or simple pn-junctions, a highly accurate calibration sample with p- and n-type regions and their various pn-transition combinations can be provided, for example.

Optionally, a minimal width of the structures (e.g. several hundred micrometer or more than one millimeter) may be set or selected and a good homogeneity of the doping in the vertical direction may be provided in order to provide defined edge conditions for the analysis (e.g. for spreading resistance calibrations or scanning capacitance analysis) and to avoid complex corrections, which consider the lateral and vertical variation of the doping of the calibration sample. For reaching a good homogeneity of the doping in the vertical direction, an implantation with several energies and diffusion processes adapted to the energy differences may be used. Alternatively or additionally, the doping profile resulting in vertical direction may be homogenized over a depth of about 5 µm very efficiently by using the channeling effect (e.g. with variations of less than 20%, less than 10% or less than 2% of an average doping, for example), which may make the analysis of the measuring results easy or may improve the accuracy of the analysis by using the described calibration sample. An implant angle of less than 0.3° over the whole semiconductor device or the wafer area may be selected for implementing an efficient channeling. In combination with a high energy implantation and multiple implantations, the homogeneous vertical region may be further extended. The channeling effect may be used over the whole wafer area and also for larger wafer diameters (e.g. 8" or 12") with present ion implant apparatuses. In this way, a plateau-like doping gradient may be implemented for phosphor implantation with common ion energies into a depth of nearly 5 µm and for boron implantations over a depth of 3 µm, which may be sufficient for spreading resistance analysis in order to act on the assumption of a homogeneously doped sample in the vertical direction without a (significant) loss of accuracy, since the used effective measurement volume is significantly less expanded for this method (e.g. the effective measurement volume may depend on the surface topology of the measurement tip primarily). By using only one implant energy homogeneous doping regions may be obtained with a depth of up to 400 nm (or up to 300 nm, 100 nm or 50 nm), for example.

Optionally, ohmic contact areas may be implemented at the wafer front side or wafer back side for implementing a second contact, which may be implemented by a suitable masked ion implantation act and annealing processes.

An aspect is the implementation of a calibration standard for single dopant levels and simultaneously all n-type and p-type pn-transition combinations on a semiconductor sample with low space consumption. This may be implemented by crossed implantation sequences performed stepped to each other by an offset and subsequent annealing.

The method (of implementation) may be another aspect beside the various simultaneously available structures on this calibration samples. An aspect of the method may be the implementation of low-space available crossed pn-transition structures on the same sample surface by a stepping of an implant mask, for example. Some examples of mask layouts and the stepping are described above. Another aspect relates to the implementation of marking signs and plain text labeling by using a further photo layer in order to provide an easy location of the respective structures. Further, adjustment marks for the implantation stepping acts may be placed in this layer. A marking of the implantation regions may be implemented by a marking point located centrally at an edge line of the implantation regions. In this way, the implantation region may be found easily.

Furthermore, such samples may be used as carriers or substrate samples for growing organic electric circuits. Further, such semiconductor substrates (e.g. with various pn-transition types on narrow space, for example <100 µm) may be used as basic material for research.

Embodiments may further provide a computer program having a program code for performing one of the above methods stored on a non-transitory medium, when the computer program is executed on a computer or processor. A person of skill in the art would readily recognize that steps of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . ." (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device comprising a semiconductor substrate, the semiconductor substrate comprising:
    a plurality of first doping regions of a first doping structure arranged at a main surface of the semiconductor substrate, wherein the first doping regions of the plurality of first doping regions of the first doping structure comprise dopants of a first conductivity type with different doping concentrations; and
    a plurality of second doping regions of the first doping structure arranged at the main surface of the semiconductor substrate, wherein the second doping regions of the plurality of second doping regions of the first doping structure comprise dopants of a second conductivity type with different doping concentrations,
    wherein at least one first doping region of the plurality of first doping regions of the first doping structure partly overlaps at least one second doping region of the plurality of second doping regions of the first doping structure causing an overlap region arranged at the main surface.

2. The semiconductor device according to claim 1, wherein the at least one first doping region of the plurality of first doping regions of the first doping structure partly overlaps each second doping region of the plurality of second doping regions of the first doping structure causing a plurality of overlap regions arranged at the main surface.

3. The semiconductor device according to claim 1, wherein each first doping region of the plurality of first doping regions of the first doping structure partly overlaps each second doping region of the plurality of second doping regions of the first doping structure causing a plurality of overlap regions arranged at the main surface.

4. The semiconductor device according to claim 1, wherein each first doping region of the plurality of first doping regions of the first doping structure comprises a dopant concentration different from the concentrations of dopants of the other first doping regions of the plurality of first doping regions of the first doping structure.

5. The semiconductor device according to claim 4, wherein each second doping region of the plurality of second doping regions of the first doping structure comprises a dopant concentration different from the concentrations of dopants of the other second doping regions of the plurality of second doping regions of the first doping structure.

6. The semiconductor device according to claim 4, wherein the first doping regions of the plurality of first doping regions of the first doping structure are arranged in parallel to each other at the main surface.

7. The semiconductor device according to claim 6, wherein the second doping regions of the plurality of second doping regions of the first doping structure are arranged orthogonal to the first doping regions of the plurality of first doping regions of the first doping structure at the main surface.

8. The semiconductor device according to claim 1, further comprising a plurality of first doping regions of a second doping structure arranged at the main surface of the semiconductor substrate, wherein the first doping regions of the plurality of first doping regions of the second doping structure comprise the first conductivity type with different doping concentrations.

9. The semiconductor device according to claim 8, wherein the first doping regions of the plurality of first doping regions of the second doping structure comprise a strip shaped geometry at the main surface and are arranged in parallel to each other at the main surface.

10. The semiconductor device according to claim 1, further comprising a plurality of filled trenches arranged in parallel to each other and a plurality of first doping regions of a third doping structure, wherein the first doping regions of the plurality of first doping regions of the third doping structure comprise the first conductivity type with different doping concentrations, wherein each first doping region of the plurality of first doping regions of the third doping structure substantially orthogonally crosses the filled trenches of the plurality of filled trenches.

11. The semiconductor device according to claim 1, wherein the first doping regions of the plurality of first doping regions of the first doping structure and the second doping regions of the plurality of second doping regions of the first doping structure stay uncovered so that the main surface is at least partly externally accessible.

12. The semiconductor device according to claim 1, further comprising at least one metal layer electrically connecting at least one first doping region to a respective pad.

13. The semiconductor device according to claim 1, further comprising at least one filled alignment trench arranged in the proximity of a first doping region.

14. The semiconductor device according to claim 13, wherein the at least one filled alignment trench comprises a plurality of filled alignment trenches, wherein each filled alignment trench of the plurality of filled alignment trenches is arranged in the proximity of a first doping region or a second doping region.

15. A calibration sample for a calibration of a scanning probe device, comprising:
    a plurality of first doping regions of a first doping structure arranged at a main surface of a semiconductor substrate, wherein the first doping regions of the plurality of first doping regions of the first doping structure comprise dopants of a first conductivity type with different doping concentrations, and
    a plurality of second doping regions of the first doping structure arranged at the main surface of the semiconductor substrate, wherein the second doping regions of the plurality of second doping regions of the first doping structure comprise dopants of a second conductivity type with different doping concentrations,
    wherein at least one first doping region of the plurality of first doping regions of the first doping structure partly overlaps at least one second doping region of the plurality of second doping regions of the first doping structure causinng an overlap region arranged at the main surface.

* * * * *